(12) United States Patent
Nishimura et al.

(10) Patent No.: US 8,648,392 B2
(45) Date of Patent: Feb. 11, 2014

(54) SEMICONDUCTOR INTEGRATED CIRCUIT

(75) Inventors: Hidetoshi Nishimura, Osaka (JP); Masaki Tamaru, Kyoto (JP)

(73) Assignee: Panasonic Corporation, Osaka (JP)

( * ) Notice: Subject to any disclaimer, the term of this patent is extended or adjusted under 35 U.S.C. 154(b) by 405 days.

(21) Appl. No.: 12/947,335

(22) Filed: Nov. 16, 2010

(65) Prior Publication Data

US 2011/0073953 A1   Mar. 31, 2011

Related U.S. Application Data

(63) Continuation of application No. PCT/JP2010/002792, filed on Apr. 16, 2010.

(30) Foreign Application Priority Data

Apr. 22, 2009   (JP) .................................. 2009-104268

(51) Int. Cl.
*H01L 27/118* (2006.01)

(52) U.S. Cl.
USPC .................. 257/206; 257/369; 257/E27.026; 257/E27.028

(58) Field of Classification Search
USPC .................. 257/206, 207, 369, 401, E27.026, 257/E27.07, E27.013, E27.028; 438/129, 438/599, 921
See application file for complete search history.

(56) References Cited

U.S. PATENT DOCUMENTS

| | | | |
|---|---|---|---|
| 5,610,872 A * | 3/1997 | Toda | 365/230.06 |
| 5,773,865 A * | 6/1998 | Hidaka et al. | 257/349 |
| 6,356,118 B1 | 3/2002 | Rikino et al. | |
| 7,446,352 B2 | 11/2008 | Becker et al. | |
| 2003/0038653 A1 * | 2/2003 | Ooishi et al. | 326/33 |
| 2005/0274983 A1 | 12/2005 | Hayashi et al. | |
| 2006/0261855 A1 | 11/2006 | Hillman et al. | |
| 2006/0271902 A1 | 11/2006 | Yamashita et al. | |
| 2007/0045770 A1 | 3/2007 | Aoki | |
| 2007/0210391 A1 | 9/2007 | Becker et al. | |
| 2008/0169487 A1 | 7/2008 | Shimbo et al. | |
| 2009/0083686 A1 | 3/2009 | Itaka et al. | |

FOREIGN PATENT DOCUMENTS

| | | |
|---|---|---|
| JP | 2000-299385 | 10/2000 |
| JP | 2006-269787 | 10/2006 |
| JP | 2007-067207 | 3/2007 |
| JP | 2008-546168 | 2/2008 |
| JP | 2008-147481 | 6/2008 |
| JP | 2008-147481 A | 6/2008 |
| JP | 2008-171977 | 7/2008 |

* cited by examiner

*Primary Examiner* — Brook Kebede
(74) *Attorney, Agent, or Firm* — McDermott Will & Emery LLP

(57) ABSTRACT

A plurality of PMOS transistors are provided on a substrate along an X-axis direction such that a gate length direction of each of the PMOS transistors is parallel to the X-axis direction. A plurality of NMOS transistors are provided on the substrate along the X-axis direction such that a gate length direction of each of the NMOS transistors is parallel to the X-axis direction, and each of the plurality of NMOS transistors is opposed to a corresponding one of the PMOS transistors in the Y-axis direction. Gate lines respectively correspond to the PMOS transistors and the NMOS transistors, and are arranged parallel to each other and extend linearly along the Y-axis direction such that each of the gate lines passes through gate areas of the PMOS transistors and NMOS transistors which correspond to each of the gate lines.

20 Claims, 17 Drawing Sheets

SEMICONDUCTOR INTEGRATED CIRCUIT

CROSS-REFERENCE TO RELATED APPLICATION

This is a continuation of PCT International Application PCT/JP2010/002792 filed on Apr. 16, 2010, which claims priority to Japanese Patent Application No. 2009-104268 filed on Apr. 22, 2009. The disclosures of these applications including the specifications, the drawings, and the claims are hereby incorporated by reference in their entirety.

BACKGROUND

The present disclosure relates to semiconductor integrated circuits, and more specifically, relates to techniques for increasing accuracy of pattern dimensions of gate lines.

A gap between dimensions of lines and wavelength of exposure light is increasing as semiconductor integrated circuits become smaller. Thus, the semiconductor integrated circuits tend to be affected by diffracted light and coherent light from neighboring patterns, which results not only in poor reproduction of design patterns, but also in an increased possibility of a break or a short between neighboring patterns. Optical Proximity Correction (OPC) is known as a technique of reducing an effect of coherent light from neighboring patterns. OPC is a technique in which irregularities of line width due to space between lines are predicted, and patterns are corrected to compensate the irregularities, thereby making a final line width constant. However, the application of OPC may increase chip area because space between neighboring patterns is increased due to insertion of compensation patterns.

Patent Document 1 (U.S. Pat. No. 7,446,352) describes a technique of avoiding the effect of coherent light without using OPC. Patent Document 1 discloses a technique of configuring a logic cell by using only a one-dimensional pattern. The use of this technique does not only eliminate the need for OPC, but also allows easier application of a phase shift mask for a linear pattern. Thus, it is possible to reduce the effect of the diffracted light, and maximize contrast of a pattern.

SUMMARY

However, if the technique disclosed in Patent Document 1 is used, a gate line is separated into segments at an arbitrary location. For example, in the case where a gate line is separated into segments at a location A as shown in FIG. 17, it is not possible to completely avoid variations of the width of the gate line at a location B which is adjacent and opposite to the location A. Further, if a flip-flop or a latch is configured by only the linear gate lines disclosed in Patent Document 1 and gate lines allowing the separation at an arbitrary location, it reduces degree of freedom of the gate lines. Thus, two metal layers are used to complement the total wiring resources for achieving a circuit function. Thus, the cell height may be increased to ensure line tracks of the two metal layers in the cell. Further, yields may be reduced because of contact failure, since a double contact cannot be formed at a location where lines in adjacent layers intersect. Furthermore, another measure which considers EM (electromigration) is necessary to reduce the width of a power supply line. Therefore, in either case, a circuit area may be affected.

In view of this, it is an objective of the present disclosure to provide a semiconductor integrated circuit in which variations in dimensions between transistors are reduced and in which a circuit area is reduced.

A semiconductor integrated circuit according to one aspect of the present invention is a semiconductor integrated circuit having standard cells, wherein among the standard cells, a latch or a master slave flip-flop includes: a plurality of PMOS transistors formed on a substrate along a first direction such that a gate length direction of each of the PMOS transistors is parallel to the first direction; a plurality of NMOS transistors which are formed on the substrate along the first direction such that a gate length direction of each of the NMOS transistors is parallel to the first direction, and each of which is opposed to a corresponding one of the plurality of PMOS transistors in a second direction perpendicular to the first direction; and a plurality of gate lines which correspond to the plurality of PMOS transistors and the plurality of the NMOS transistors, and which are arranged parallel to each other and extend linearly along the second direction such that each of the gate lines passes through gate areas of the PMOS transistors and the NMOS transistors which correspond to each of the gate lines. According to the present disclosure, it is possible to reduce variations in dimensions between transistors, and possible to reduce a circuit area of a semiconductor integrated circuit.

DETAILED DESCRIPTION

Figure 1:
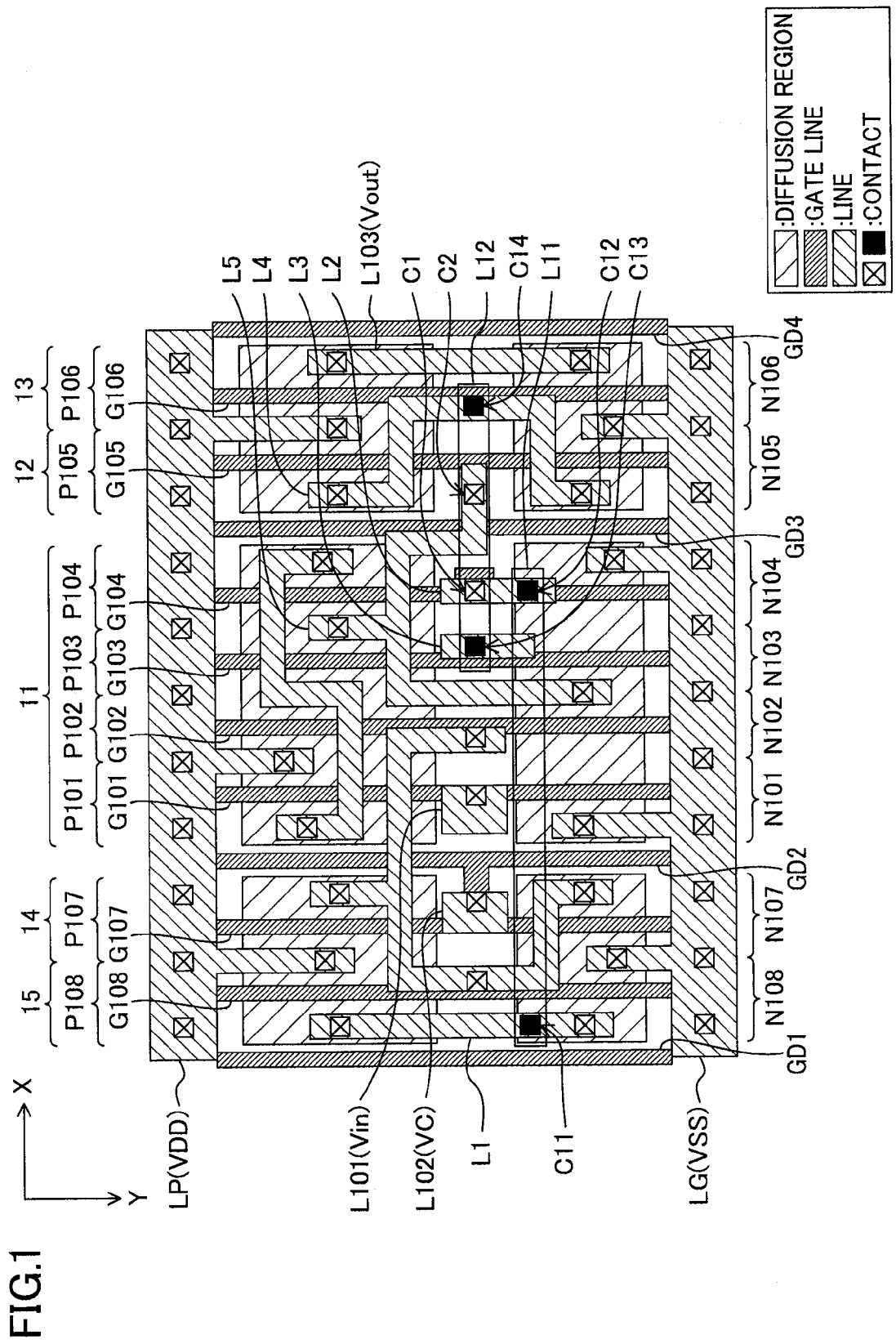
FIG. 1 is an example layout of a semiconductor integrated circuit according to the first embodiment.

Embodiments will be described in detail hereinafter with reference to the drawings. In the drawings, like reference characters have been used to designate identical or equivalent elements, and explanation thereof is not repeated.

(First Embodiment)

FIG. 1 shows an example layout of a semiconductor integrated circuit according to the first embodiment. The semiconductor integrated circuit includes PMOS transistors P101, P102, . . . , P108, NMOS transistors N101, N102, . . . , N108, gate lines G101, G102, . . . , G108, and dummy gate lines GD1, GD2, . . . , GD4. Further, the semiconductor integrated circuit is provided with a plurality of lines (e.g., a power supply line LP, a ground line LG, input lines L101, L102, and an output line L103) and a plurality of contacts. The power supply line LP and the ground line LG transmit a power supply voltage VDD and a ground voltage VSS, respectively. The input lines L101, L102 transmit input signals Vin and VC, respectively. The output line L103 transmits an output signal Vout. In FIG. 1, lines L11 and L12 are shown as being transparent to facilitate understanding of the connection between the elements.

<Circuit Configuration>

Figure 2:
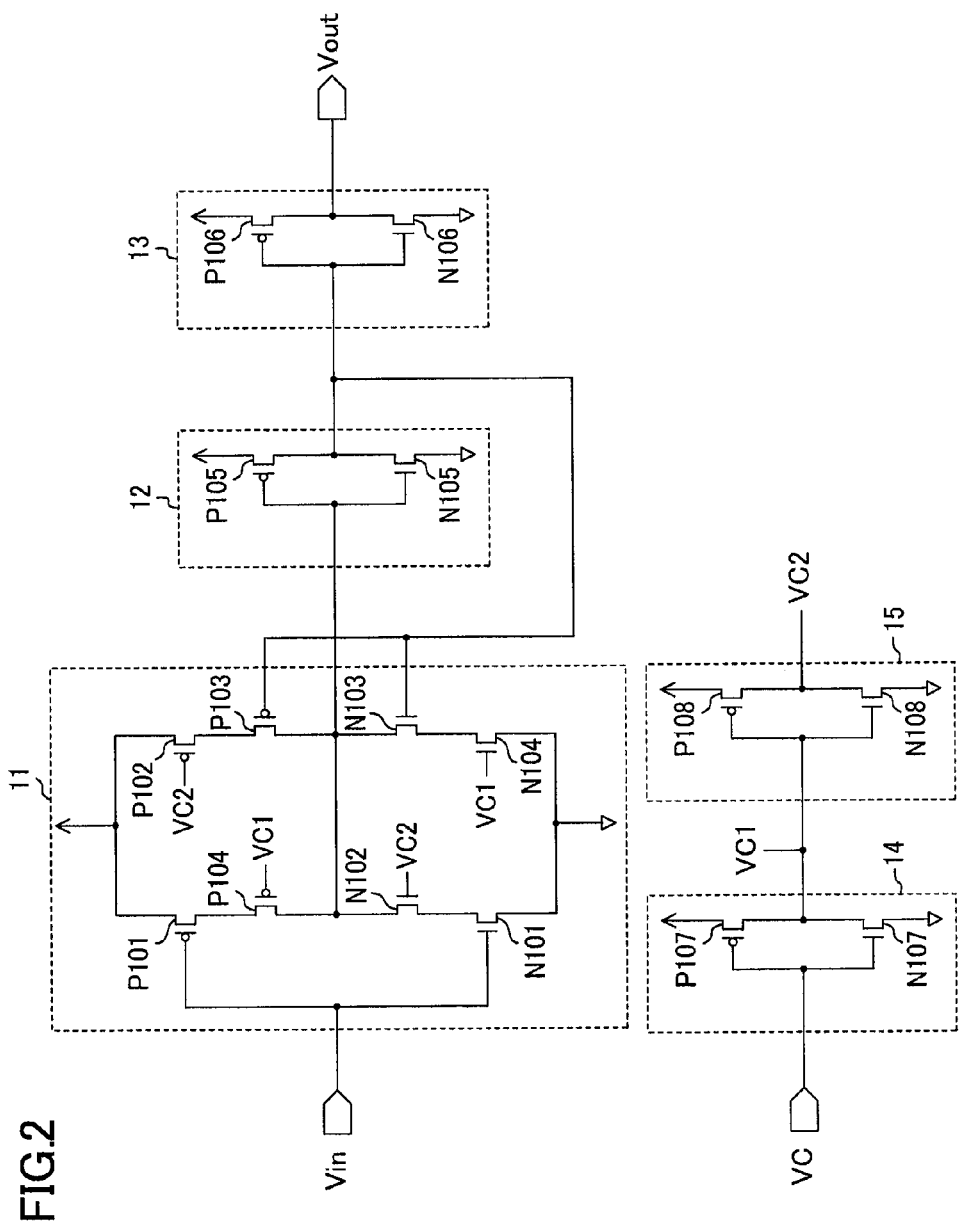
FIG. 2 is a drawing for explaining a circuit configuration of a latch circuit formed in the semiconductor integrated circuit shown in FIG. 1.
Figure 3:
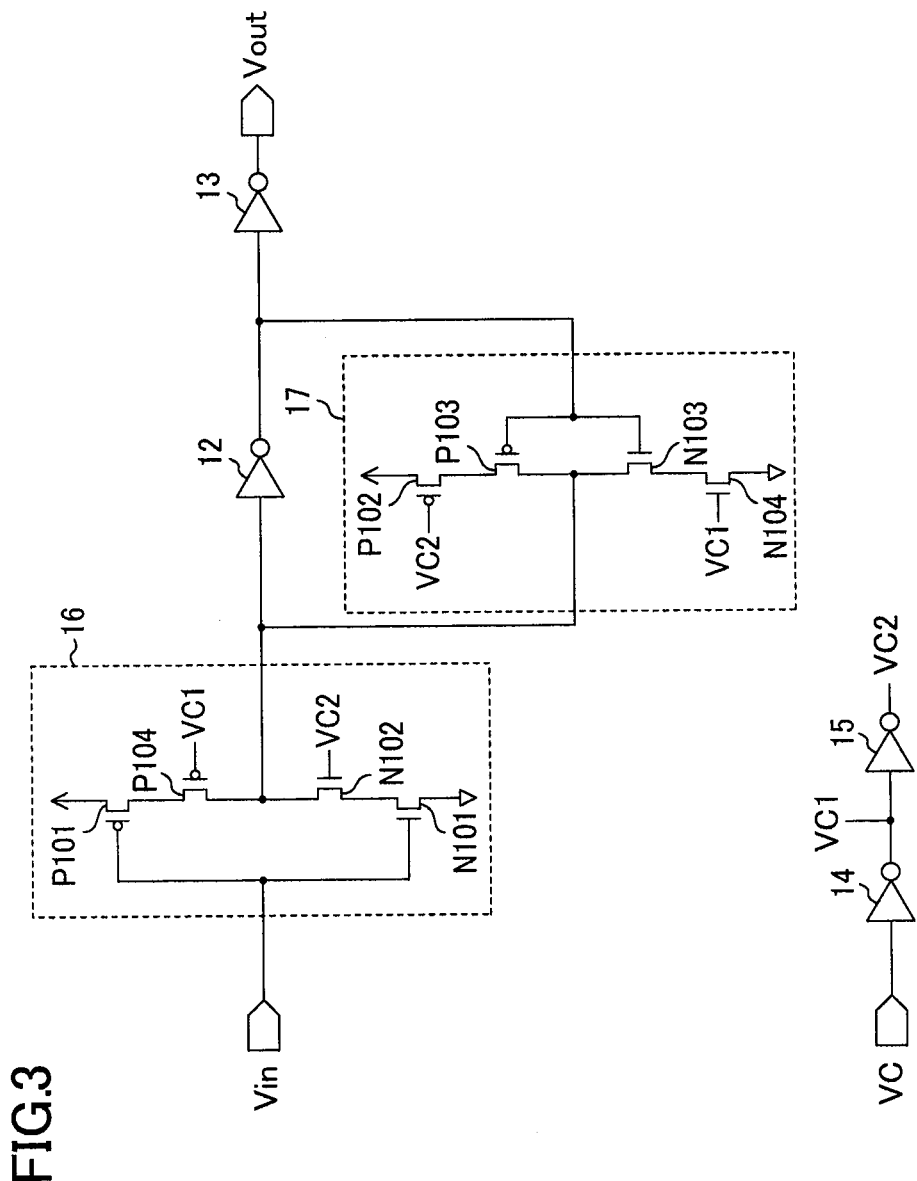
FIG. 3 is a drawing for explaining a circuit configuration of a latch circuit formed in the semiconductor integrated circuit shown in FIG. 1.

The layout shown in FIG. 1 corresponds to the circuit configuration shown in FIG. 2. A combinational circuit 11 includes the PMOS transistors P101, P102, . . . , P104, and NMOS transistors N101, N102, . . . , N104. Inverter circuits 12, 13, . . . , 15 include the PMOS transistors P105, P106, . . . , P108, respectively, and the NMOS transistors N105, N106, . . . , N108, respectively. The circuit configuration shown in FIG. 2 can be obtained by modifying the circuit configuration shown in FIG. 3. Specifically, the combinational circuit 11 shown in FIG. 2 can be implemented by combining tri-state inverter circuits 16, 17, shown in FIG. 3, together. That is, the semiconductor integrated circuit shown in FIG. 1 includes, as a standard cell, a latch circuit having the tri-state inverter circuits 16, 17 and the inverter circuits 12, 13, . . . , 15. According to the latch circuit, if the input signal VC transitions from a low level to a high level, an output (a control signal VC1) of the inverter circuit 14 and an output (a control signal VC2) of the inverter circuit 15 become a low level and a high level, respectively. As a result, an inverted signal of the input signal Vin is output as the output signal Vout. On the other hand, if the input signal VC transitions from a high level to a low level, an inverter loop is formed by the inverter circuit 12 and the tri-state inverter circuit 17, and the logical level of the output signal Vout is maintained at the same logical level as before the transition of the input signal VC from a high level to a low level. The semiconductor integrated circuit shown in FIG. 1 may include not only the standard cell which functions as a latch circuit, but also other standard cells.

<Connection Between Elements>

Next, the connection between respective elements of the semiconductor integrated circuit shown in FIG. 1 will be briefly described. For example, the PMOS transistor P101 shares, with the adjacent PMOS transistor P102, a P type diffusion region which serves as a source region for both transistors. The source region of the PMOS transistor P101 (or the source region of the PMOS transistor P102) is electrically connected to the power supply line LP via a contact. Further, a drain region of the PMOS transistor P101 is electrically connected to a source region of the PMOS transistor P104 via two contacts and a line. As a result, the PMOS transistors P101 and P104 are connected in series. On the other hand, the NMOS transistor N101 shares, with the adjacent NMOS transistor N102, an N type diffusion region which serves as a drain region of the NMOS transistor N101 and a source region of the NMOS transistor N102. As a result, the NMOS transistors N101 and N102 are connected in series. Further, a source region of the NMOS transistor N101 is electrically connected to the ground line LG via a contact. The gate line G101 is electrically connected to the input line L101 via a contact. This structure allows the input signal Vin to be transmitted to each gate of the PMOS transistor P101 and the NMOS transistor N101.

The line L11 is electrically connected to the lines L1, L2 via the contacts C11, C12, respectively. The line L2 is electrically connected to the gate line G104 via a contact C1. This structure allows an output (a control signal VC2) of the inverter circuit 15 to be transmitted to the gates of the PMOS transistor P104 and the NMOS transistor N104. The line L12, the line L3, and the gate line G103 are electrically connected to each other via a contact C13. The line L12, the line L4, and the gate line G106 are electrically connected to each other via a contact C14. This structure allows an output of the inverter circuit 12 to be transmitted to the respective gates of the PMOS transistor P103 and the NMOS transistor N103, and an input of the inverter circuit 13. Further, the line L5 is electrically connected to the gate line G105 via a contact C2. Thus, an input of the inverter circuit 12 is connected to the respective drains of the PMOS transistors P103, P104 and NMOS transistors N102, N103.

Figure 4:
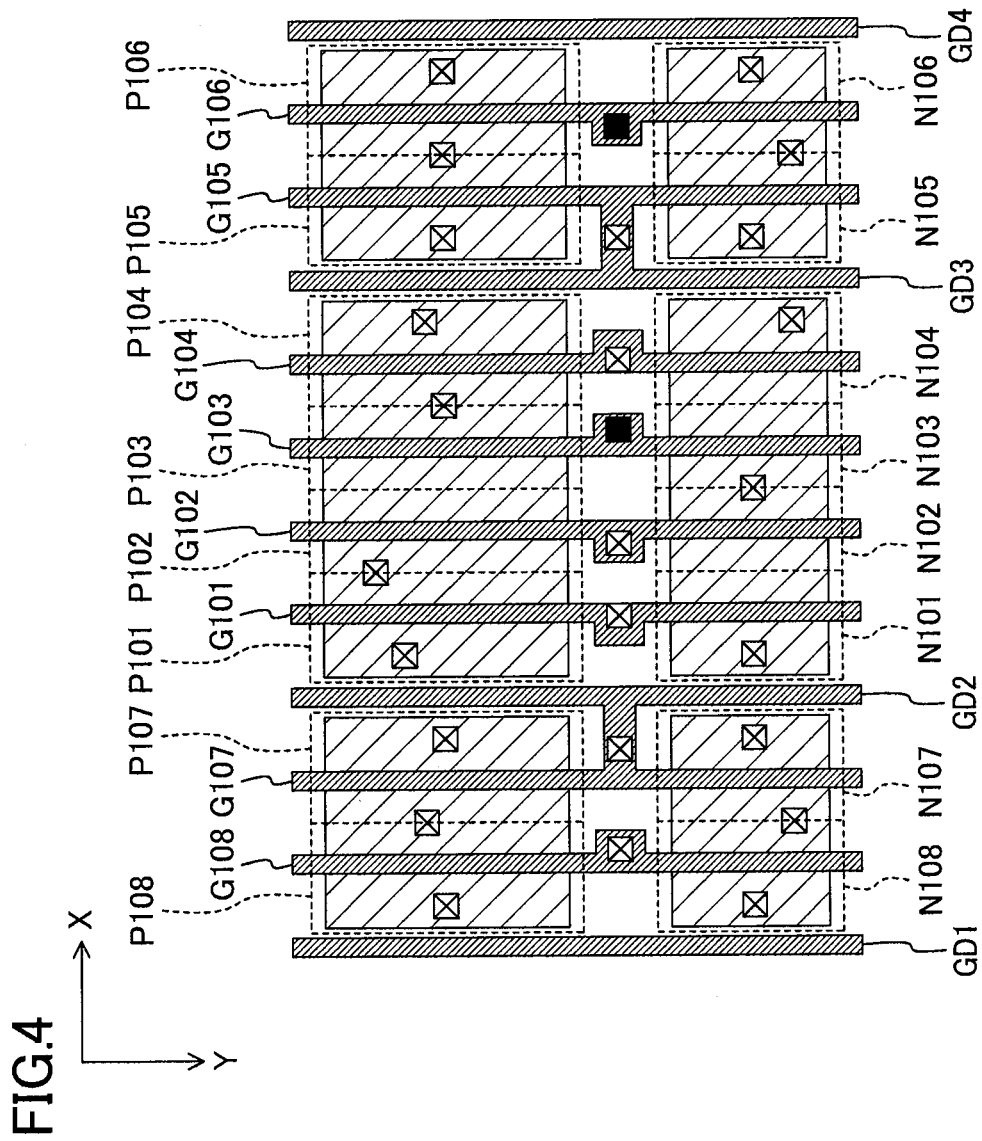
FIG. 4 is a drawing for explaining a plurality of PMOS transistors, a plurality of NMOS transistors, and a plurality of gate lines, shown in FIG. 1.

Next, configuration and arrangement of a plurality of PMOS transistors, a plurality of NMOS transistors, and a plurality of gate lines, shown in FIG. 1, will be described with reference to FIG. 4. To facilitate understanding the connection between elements, FIG. 4 (FIG. 9 and FIG. 14 as well) also shows contacts connected to a diffusion region (a source region/a drain region) or a gate line.

<PMOS Transistor>

The PMOS transistors P101, P102, . . . , P108 are formed on the substrate along an X-axis direction such that the gate length direction of each of the PMOS transistors is parallel to the X-axis direction. Here, each of the PMOS transistors P101, P102, . . . , P104 shares a P type diffusion region with its adjacent PMOS transistor. Similarly, the PMOS transistor P105 shares, with the PMOS transistor P106, a P type diffusion region which serves as a source region for both transistors. The PMOS transistor P107 shares a P type diffusion region with the PMOS transistor P108.

<NMOS Transistor>

Similar to the PMOS transistors P101, P102, . . . , P108, the NMOS transistors N101, N102, . . . , N108 are formed on the substrate along the X-axis direction such that the gate length direction of each of the NMOS transistors is parallel to the X-axis direction. Further, the NMOS transistors N101, N102, . . . , N108 are opposed to the PMOS transistors P101, P102, . . . , P108, respectively, in a Y-axis direction perpendicular to the X-axis direction. Here, each of the NMOS transistors N101, N102, . . . , N104 shares an N type diffusion region with its adjacent NMOS transistor. Similarly, the NMOS transistor N105 shares, with the NMOS transistor N106, an N type diffusion region which serves as a source region for both transistors. The NMOS transistor N107 shares an N type diffusion region with the NMOS transistor N108.

<Gate Line>

The gate lines G101, G102, . . . , G108 correspond to the PMOS transistors P101, P102, . . . , P108 and the NMOS transistors N101, N102, . . . , N108, respectively. The gate lines G101, G102, . . . , G108 are arranged parallel to each other and extend linearly along the Y-axis direction such that each of the gate lines G101, G102, . . . , G108 passes through the gate areas of the PMOS transistors and the NMOS transistors which correspond to each of the gate lines G101, G102, . . . , G108. Specifically, each of the gate lines G101, G102, . . . , G108 includes: a PMOS gate electrode portion which extends along the Y-axis direction in the gate area of the PMOS transistor so as to function as a gate electrode of the PMOS transistors P101, P102, . . . , P108; an NMOS gate electrode portion which extends along the Y-axis direction in the gate area of the NMOS transistor so as to function as a gate electrode of the NMOS transistors N101, N102, . . . , N108; and a line main portion which extends along the Y-axis direction to linearly connect the PMOS gate electrode portion and the NMOS gate electrode portion together.

<Dummy Gate Line>

The dummy gate lines GD1, GD2, . . . , GD4 are arranged parallel to, and extend linearly along, the Y-axis direction, together with the gate lines G101, G102, . . . , G108. The dummy gate lines GD1, GD4 are not electrically connected to any one of the PMOS transistors P101, P102, . . . , P108 and the NMOS transistors N101, N102, . . . , N108. Here, the gate lines G107, G105 are connected to the dummy gate lines GD2, GD3, respectively, via gate connecting lines, or may be connected to the dummy gate lines GD2, GD3 via metal lines.

<Projections and Connecting Line>

Each of the plurality of gate lines may have a line main portion which linearly extends along the Y-axis direction, and a projection which projects out from a predetermined location of the line main portion toward the X-axis direction. Further, the projection may be electrically connected to a line via a contact. For example, in the semiconductor integrated circuit shown in FIG. 1, the gate lines G101, G102, . . . , G104, G106, G108 have such a projection as described above. Further, at least a pair of adjacent gate lines (or, at least a pair of adjacent gate line and dummy gate line) may be connected to each other via a connecting line extending from a predetermined location of one gate line to a predetermined location of the other gate line. For example, in the semiconductor integrated circuit shown in FIG. 1, the gate line G105 and the dummy gate line GD3 are connected to each other via a connecting line extending from a predetermined location of the gate line G105 to a predetermined location of the dummy gate line GD3. That is, the gate line G105, the dummy gate line GD3, and the connecting line form a gate region in the general shape of a letter "H" when viewed from above.

As described above, the PMOS transistors P101, P102, . . . , P108 and the NMOS transistors N101, N102, . . . , N108 are arranged such that the PMOS transistor and the NMOS transistor which receive the same signal in the respective gates in the circuit configuration are opposed to each other. Such arrangement allows the linearly extending gate lines G101, G102, . . . , G108 to be laid out. Thus, unlike the conventional technique, there is no separation of the gate line at an arbitrary location, and therefore, it is possible to reduce variations in dimensions of a gate line provided close to the separation portion. Further, the adjacent gate lines are connected to each other at a predetermined location to form an H-shaped gate line. The H-shaped gate line allows the gate lines to be used as a wiring resource for a latch function. Thus, it is possible to avoid an increase in the cell height due to an increase in wiring resources of the two metal layers, and possible to reduce the size of a semiconductor integrated circuit.

(Variation of First Embodiment)

Figure 5:
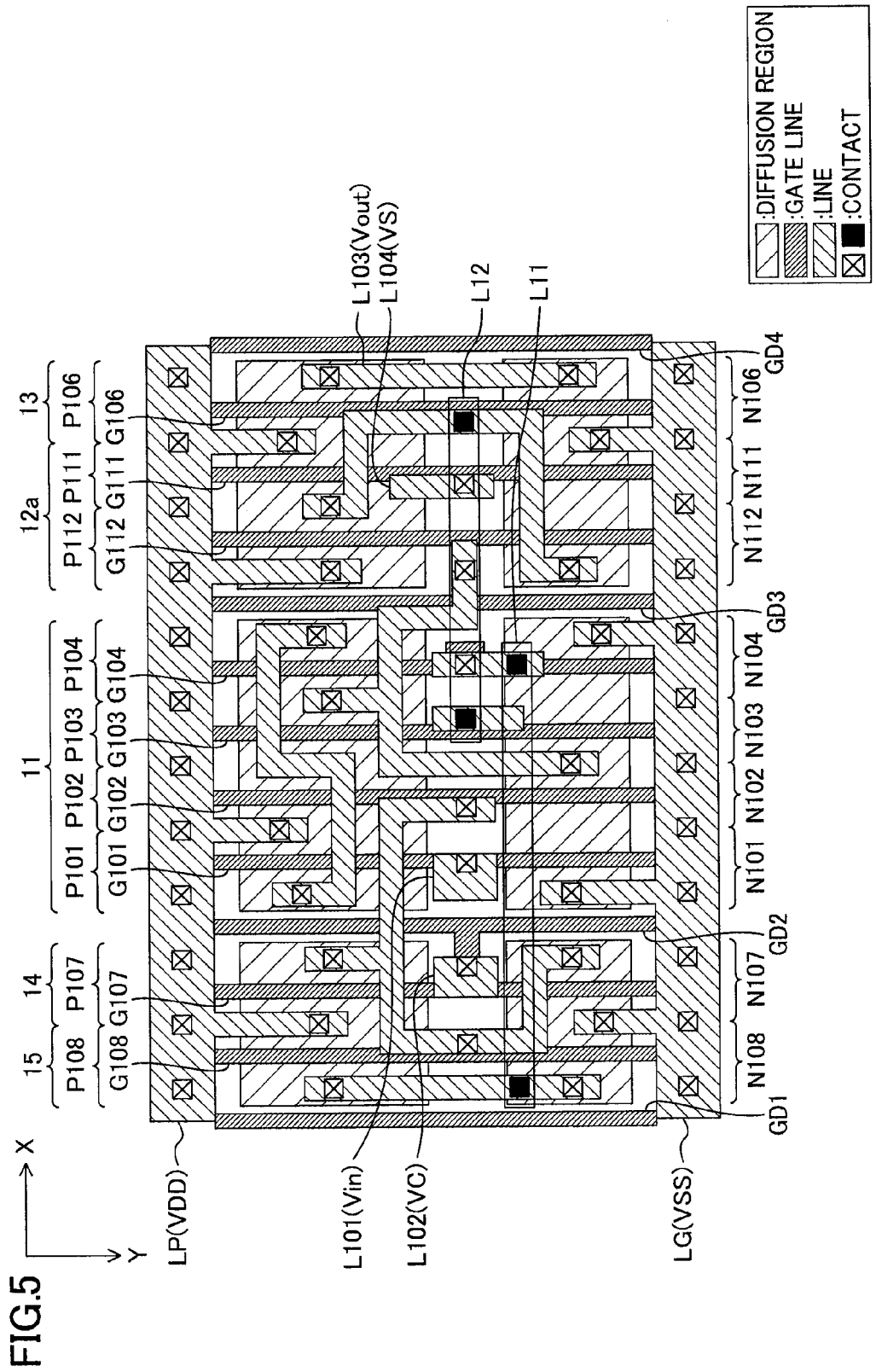
FIG. 5 is an example layout of a semiconductor integrated circuit according to the first variation of the first embodiment.

FIG. 5 shows an example layout of a semiconductor integrated circuit according to the first variation of the first embodiment. The semiconductor integrated circuit includes PMOS transistors P111, P112, NMOS transistors N111, N112, and gate lines G111, G112, in place of the PMOS transistor P105, the NMOS transistor N105, and the gate line G105 shown in FIG. 1. Here, an input line L104 transmits an input signal VS.

Figure 6:
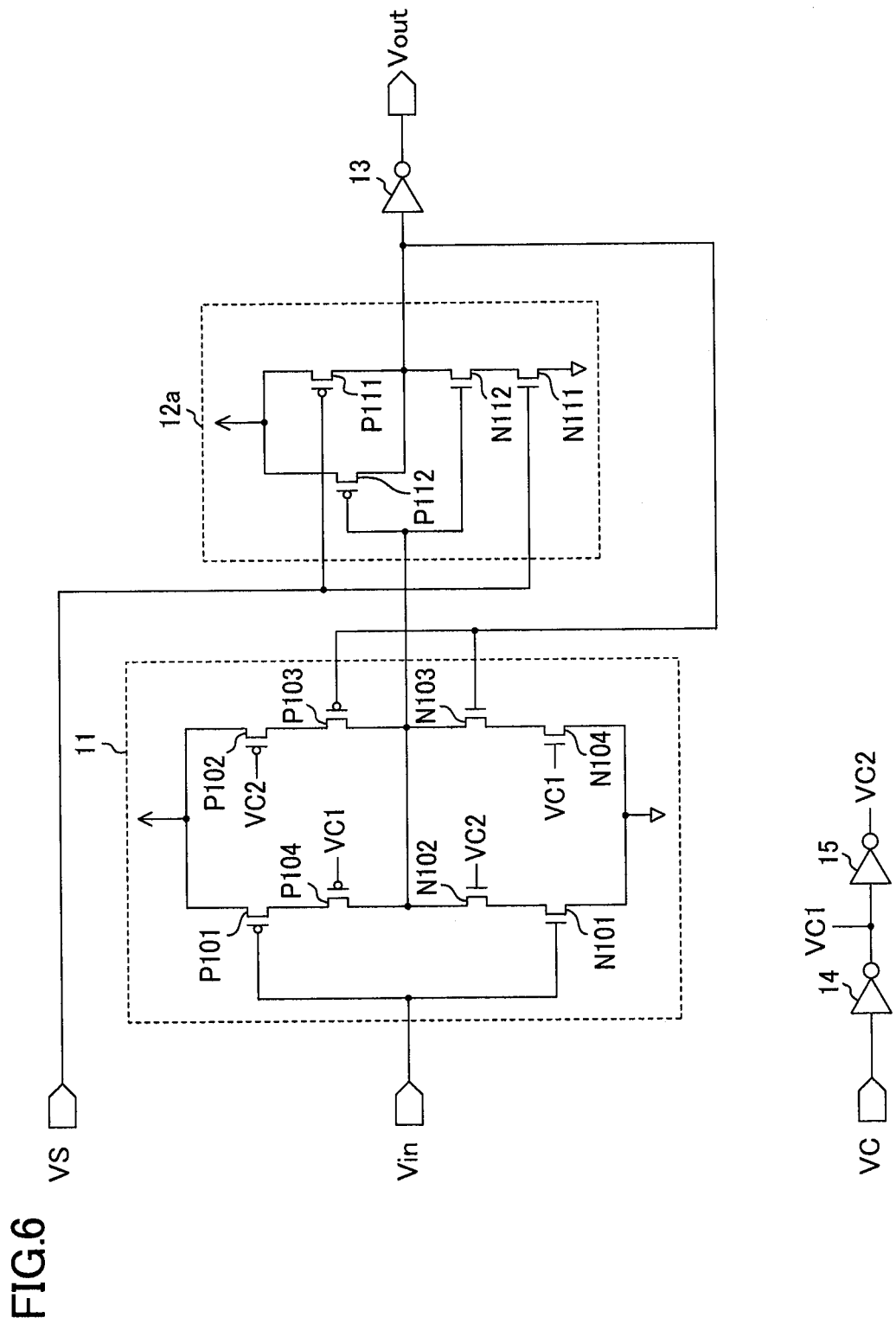
FIG. 6 is a drawing for explaining a circuit configuration of a latch circuit formed in the semiconductor integrated circuit shown in FIG. 5.
Figure 7:
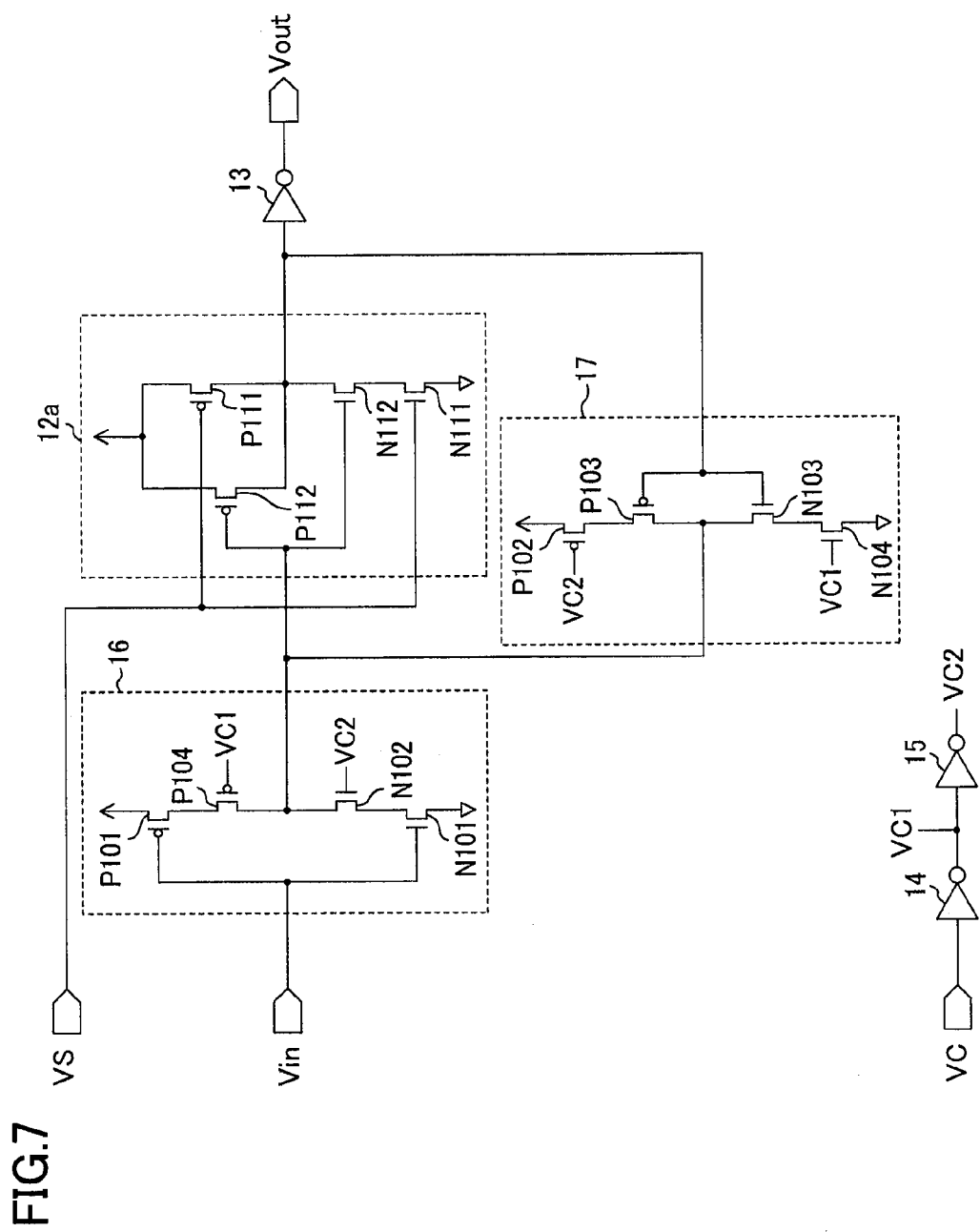
FIG. 7 is a drawing for explaining a circuit configuration of a latch circuit formed in the semiconductor integrated circuit shown in FIG. 5.

The layout shown in FIG. 5 corresponds to the circuit configuration shown in FIG. 6. A NAND circuit 12a includes the PMOS transistors P111, P112 and the NMOS transistors N111, N112. Further, the circuit configuration shown in FIG. 6 can be obtained by modifying the circuit configuration shown in FIG. 7. That is, the semiconductor integrated circuit shown in FIG. 5 includes, as a standard cell, a latch circuit having tri-state inverter circuits 16, 17, the NAND circuit 12a, and the inverter circuits 13, 14, 15 (i.e., a latch circuit having a setting function). According to this latch circuit, if the input signal VS is at a low level, an output of the NAND circuit 12a is set to a high level. As a result, an output signal Vout can be set to a low level. Here, the semiconductor integrated circuit shown in FIG. 5 may include not only the standard cell which functions as a latch circuit, but also other standard cells.

(Second Embodiment)

Figure 8:
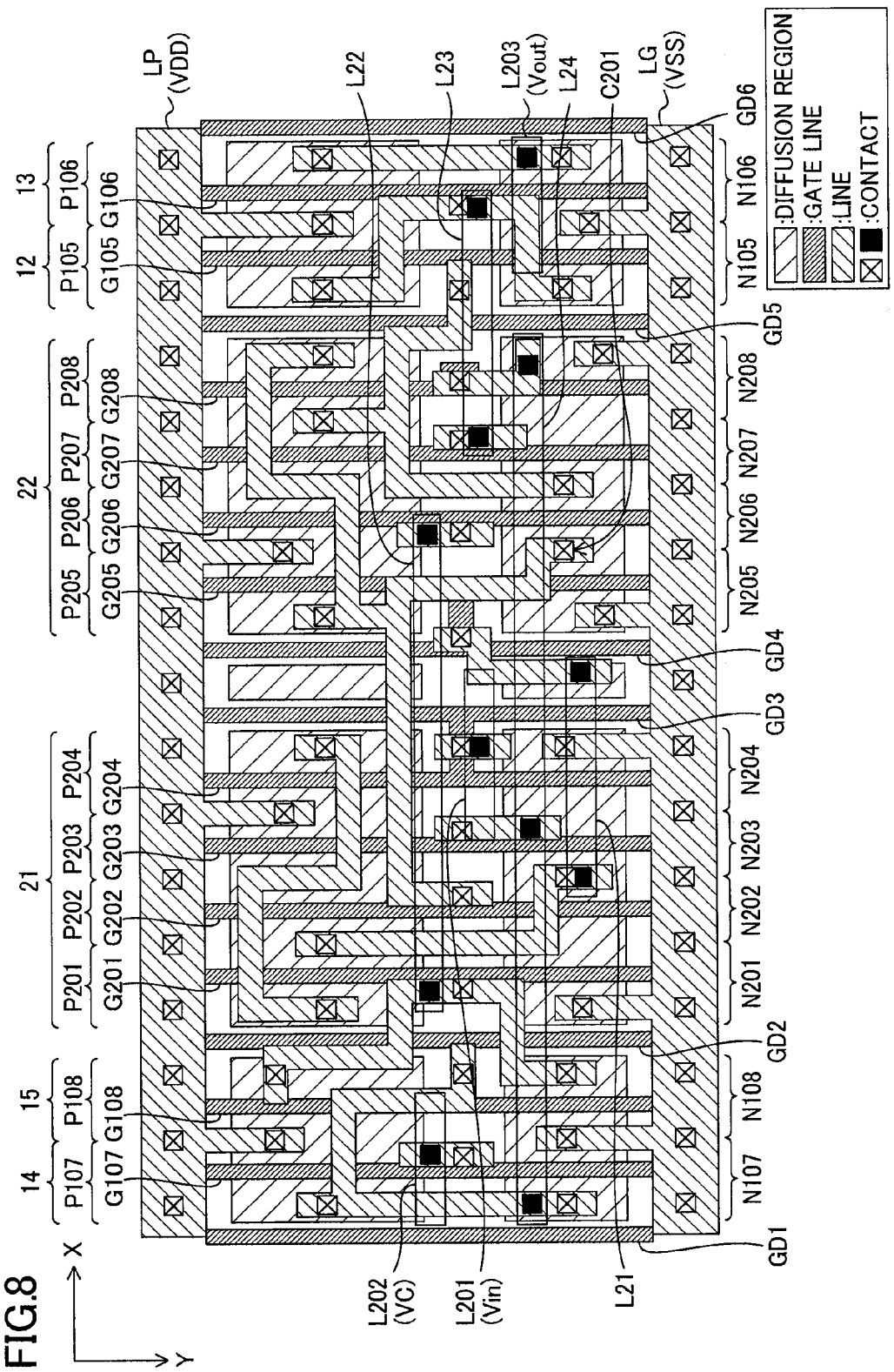
FIG. 8 is an example layout of a semiconductor integrated circuit according to the second embodiment.

FIG. 8 shows an example layout of a semiconductor integrated circuit according to the second embodiment. The semiconductor integrated circuit includes PMOS transistors P201, P202, . . . , P208, NMOS transistors N201, N202, . . . , N208, and gate lines G201, G202, . . . , G208, in place of the PMOS transistors P101, P102, . . . , P104, the NMOS transistors N101, N102, . . . , N104, and the gate lines G101, G102, . . . , G104. The semiconductor integrated circuit further includes dummy gate electrodes GD5, GD6. The input lines L201, L202 transmit input signals Vin, VC, respectively. The output line L203 transmits an output signal Vout. In FIG. 8, lines L201, L202, L203, L21, L22, . . . , L24 are shown as being transparent to facilitate understanding of the connection between elements.

Figure 9:
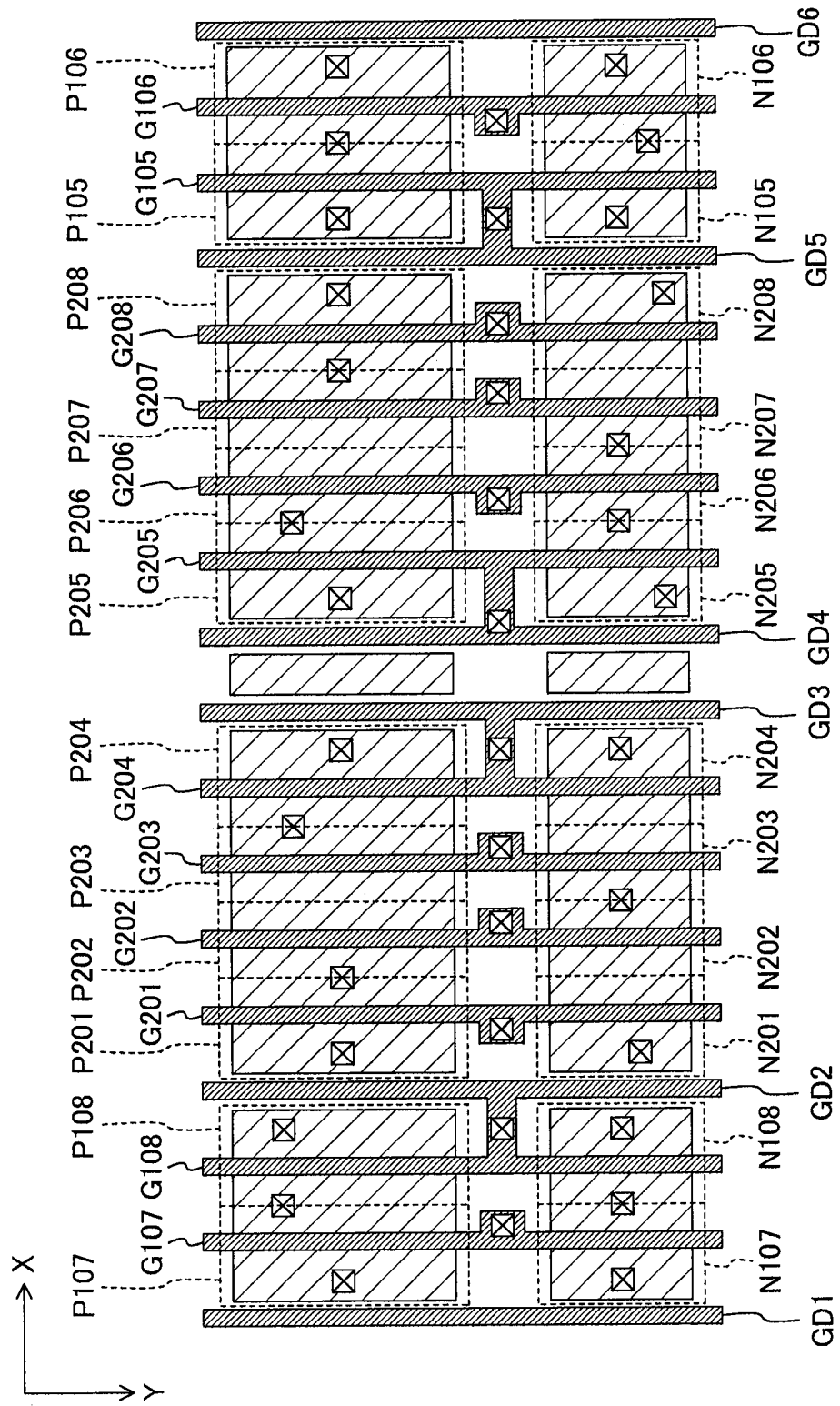
FIG. 9 is a drawing for explaining a plurality of PMOS transistors, a plurality of NMOS transistors, and a plurality of gate lines, shown in FIG. 8.

As shown in FIG. 9, the PMOS transistors P201, P202, . . . , P208 are formed on the substrate along an X-axis direction such that the gate length direction of each of the PMOS transistors is parallel to the X-axis direction. Similar to the PMOS transistors P201, P202, . . . , P208, the NMOS transistors N201, N202, . . . , N208 are formed on the substrate along the X-axis direction such that the gate length direction of each of the NMOS transistors is parallel to the X-axis direction. Further, the NMOS transistors N201, N202, . . . , N208 are opposed to the PMOS transistors P201, P202, . . . , P208, respectively, in the Y-axis direction. The gate lines G201, G202, . . . , G208 correspond to the PMOS transistors P201, P202, . . . , P208 and the NMOS transistors N201, N202, . . . , N208, respectively. The gate lines G201, G202, . . . , G208 are arranged parallel to each other and extend linearly along the Y-axis direction such that each of the gate lines G201, G202, . . . , G208 passes through the gate areas of the PMOS transistors and the NMOS transistors which correspond to each of the gate lines G201, G202, . . . , G208. Here, the gate lines G108, G204, G205, G105 are connected to the dummy gate lines GD2, GD3, GD4, GD5, respectively, via gate connecting lines, or may be connected to the dummy gate lines GD2, GD3, GD4, GD5 via metal lines.

Figure 10:
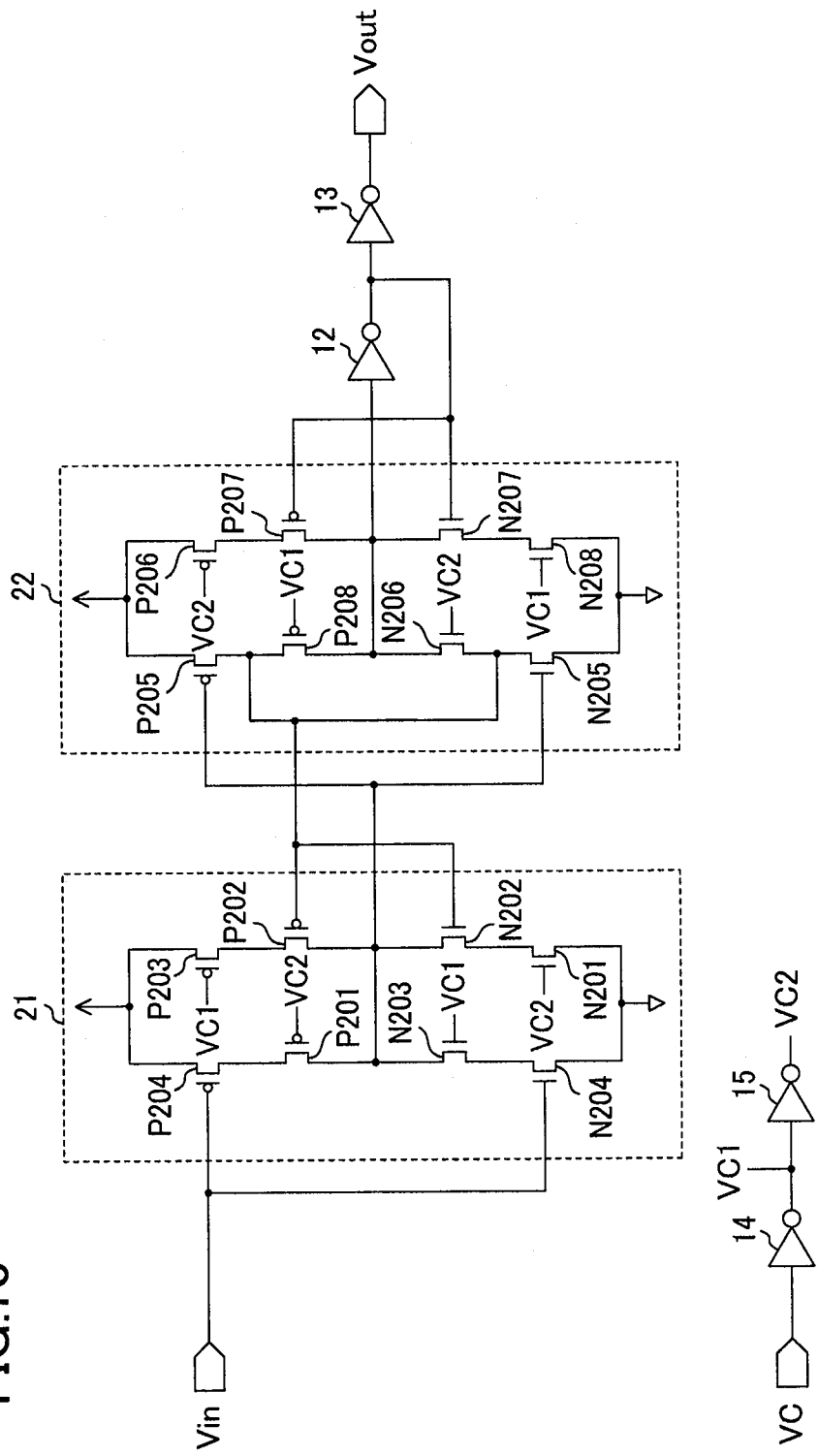
FIG. 10 is a drawing for explaining a circuit configuration of a flip-flop circuit formed in the semiconductor integrated circuit shown in FIG. 8.
Figure 11:
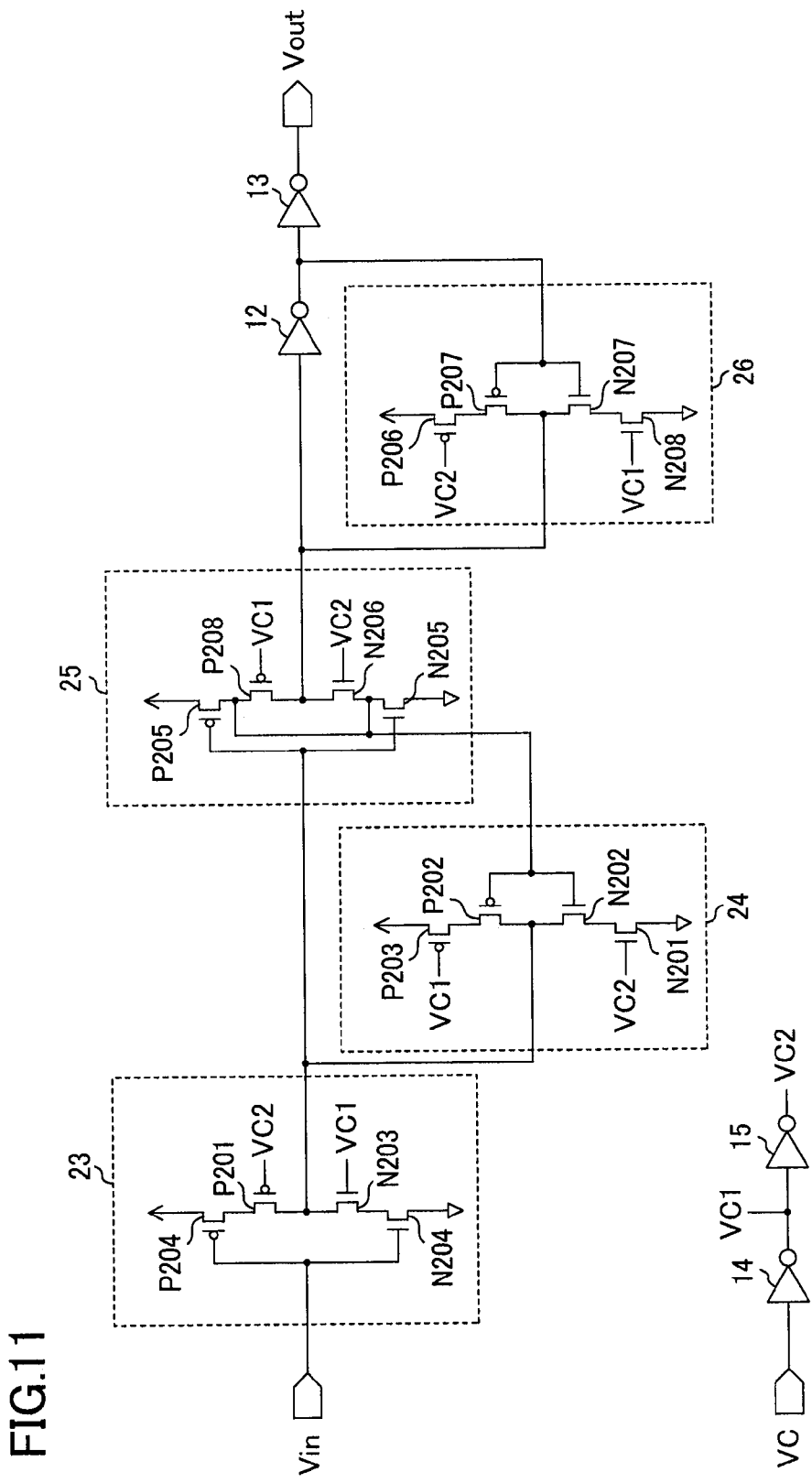
FIG. 11 is a drawing for explaining a circuit configuration of a flip-flop circuit formed in the semiconductor integrated circuit shown in FIG. 8.
Figure 12:
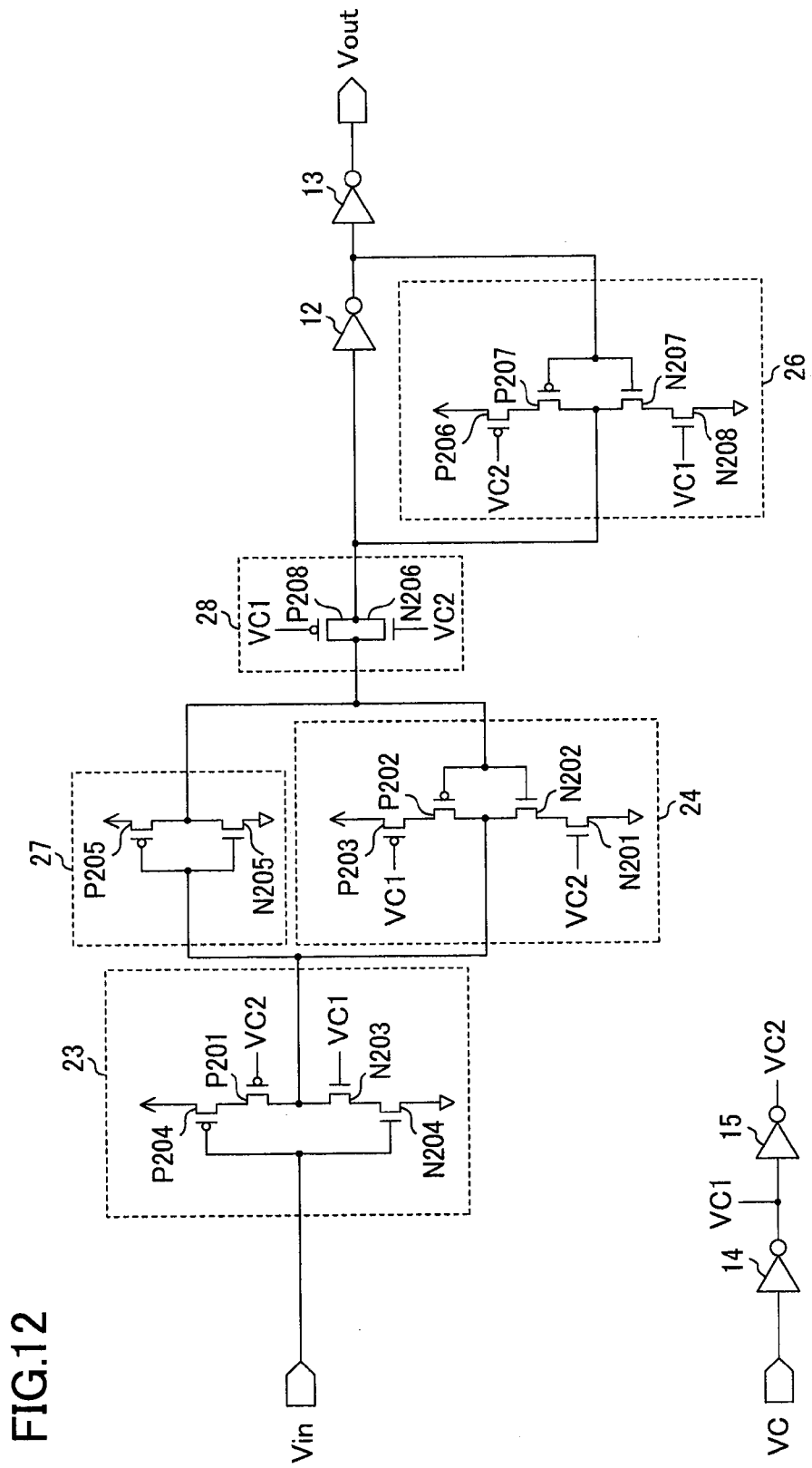
FIG. 12 is a drawing for explaining a circuit configuration of a flip-flop circuit formed in the semiconductor integrated circuit shown in FIG. 8.

The layout shown in FIG. 8 corresponds to the circuit configuration shown in FIG. 10. The combinational circuit 21 includes the PMOS transistors P201, P202, . . . , P204 and the NMOS transistors N201, N202, . . . , N204. The combinational circuit 22 includes the PMOS transistors P205, P206, . . . , P208 and the NMOS transistors N205, N206, . . . , N208. The circuit configuration shown in FIG. 10 can be obtained by modifying the circuit configuration shown in FIG. 11. Specifically, the combinational circuit 21 shown in FIG. 10 can be implemented by combining tri-state inverter circuits 23, 24, shown in FIG. 11, together. The combinational circuit 22 shown in FIG. 10 can be implemented by combining a combinational circuit 25 with a tri-state inverter circuit 26 shown in FIG. 11. Further, the circuit configuration shown in FIG. 11 can be obtained by modifying the circuit configuration shown in FIG. 12. Specifically, the combinational circuit 25 shown in FIG. 11 can be implemented by combining an inverter circuit 27 with a transfer gate 28 shown in FIG. 12. That is, the semiconductor integrated circuit shown in FIG. 8 includes, as a standard cell, a flip-flop circuit having the tri-state inverter circuits 23, 24, 26, the transfer gate 28, and the inverter circuits 12, 13, . . . , 15, 27 (i.e., a master slave D flip-flop circuit). Further, the semiconductor integrated circuit shown in FIG. 8 may include not only the standard cell which functions as a flip-flop circuit, but also other standard cells.

As described above, the PMOS transistors P201, P202, . . . , P208 and the NMOS transistors N201, N202, . . . , N208 are arranged such that the PMOS transistor and the NMOS transistor which receive the same signal in the respective gates in the circuit configuration are opposed to each other. Such arrangement allows the linearly extending gate lines G201, G202, . . . , G208 to be laid out. As described, the latch configurations described in the first embodiment are combined together, and thereby, can be applied to a flip-flop circuit. Therefore, as in the case of the semiconductor integrated circuit shown in FIG. 1, it is possible to reduce variations in dimensions between transistors, and possible to reduce the size of the semiconductor integrated circuit.

Turning to the configurations of the combinational circuits 21, 22 shown in FIG. 8, the layout of the combinational circuit 21 and the layout of the combinational circuit 22 are symmetrical, except the location of the contact C201. Thus, it is possible to easily design the layout of the combinational circuit 22, based on the layout of the combinational circuit 21.

(Variation of Second Embodiment)

Figure 13:
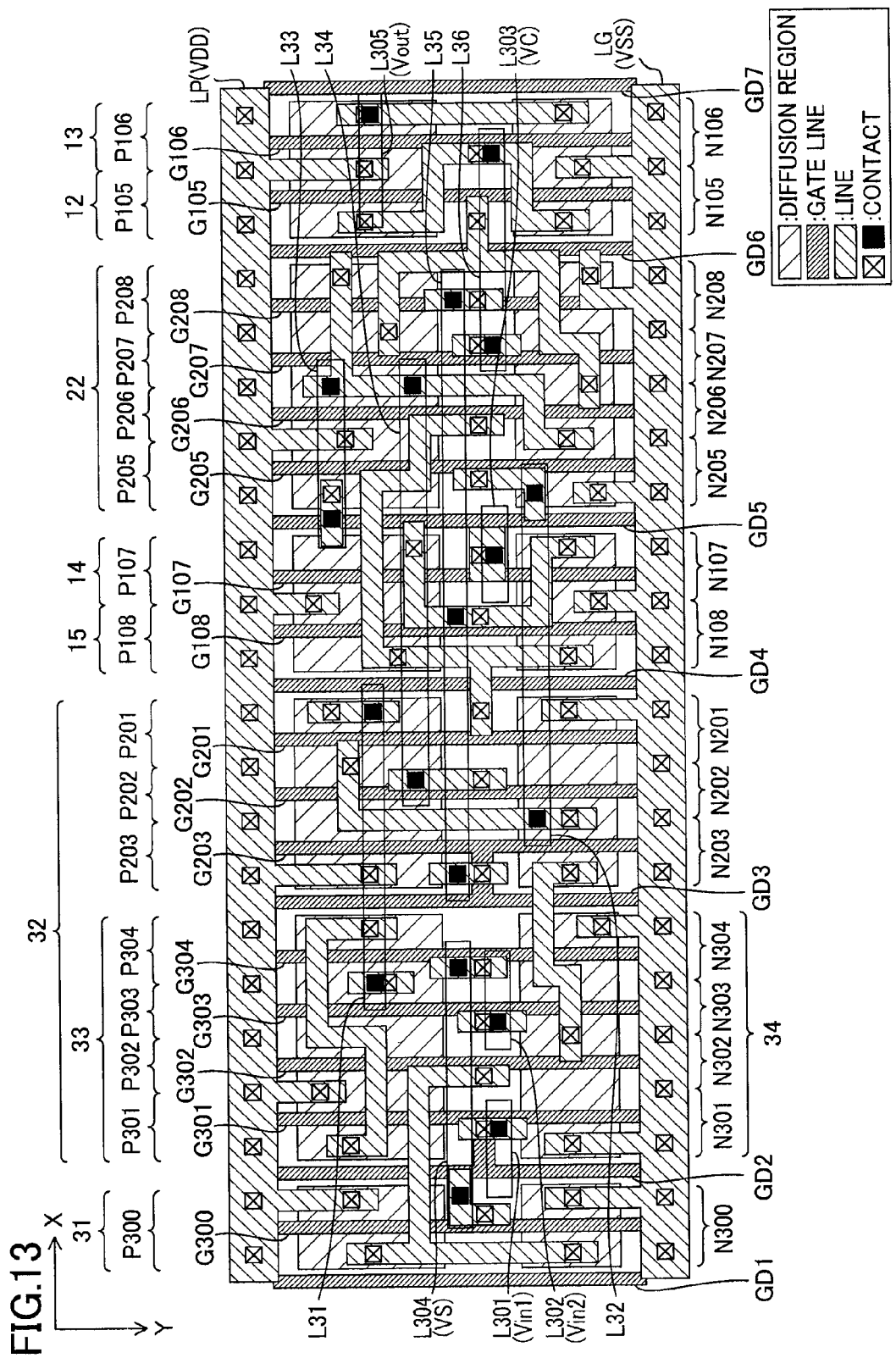
FIG. 13 is an example layout of a semiconductor integrated circuit according to a variation of the second embodiment.

FIG. 13 shows an example layout of a semiconductor integrated circuit according to a variation of the second embodiment. The semiconductor integrated circuit includes PMOS transistors P301, P302, . . . , P304, NMOS transistors N301, N302, . . . , N304, and gate lines G301, G302, . . . , G304, in place of the PMOS transistor P201, the NMOS transistor N201, and the gate line G201, shown in FIG. 8. Further, the semiconductor integrated circuit further includes a dummy gate line GD7. Input lines L301, L302, L303, L304 transmit input signals Vin1, Vin2, VC, VS, respectively. An output line L305 transmits an output signal Vout. In FIG. 13, the lines L301, L302, . . . , L304, L31, L32, . . . , L36 are shown as being transparent to facilitate understanding of the connection between elements.

Figure 14:
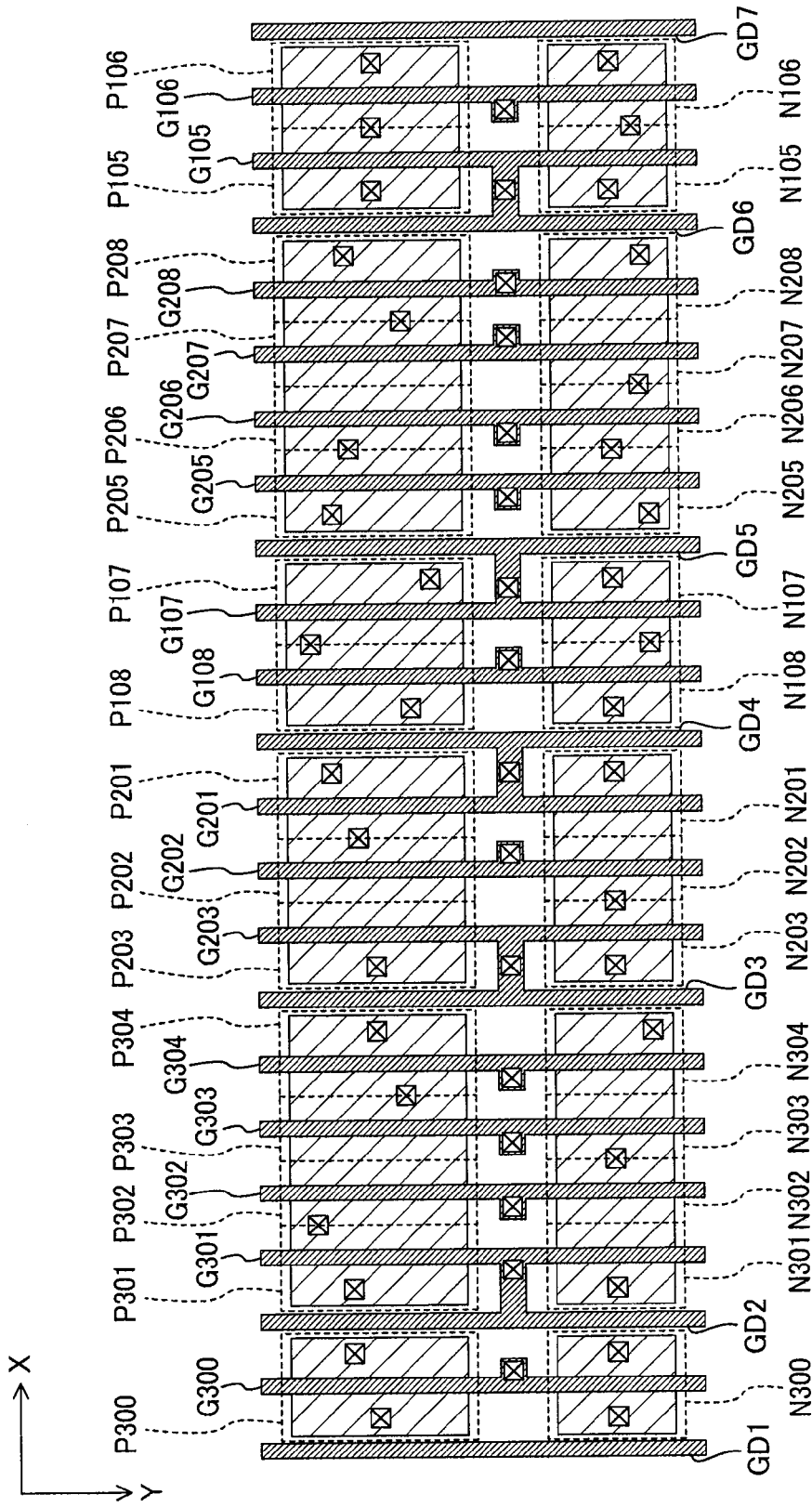
FIG. 14 is a drawing for explaining a plurality of PMOS transistors, a plurality of NMOS transistors, and a plurality of gate lines, shown in FIG. 13.

As shown in FIG. 14, the PMOS transistors P301, P302, . . . , P304 are formed on the substrate along an X-axis direction such that the gate length direction of each of the PMOS transistors is parallel to the X-axis direction. Similar to the PMOS transistors P301, P302, . . . , P304, the NMOS transistors N301, N302, . . . , N304 are formed on the substrate along the X-axis direction such that the gate length direction of each of the NMOS transistors is parallel to the X-axis direction. Further, the NMOS transistors N301, N302, . . . , N304 are opposed to the PMOS transistors P301, P302, . . . , P304, respectively, in a Y-axis direction. The gate line G301, G302, . . . , G304 correspond to PMOS transistors P301, P302, . . . , P304 and the NMOS transistors N301, N302, . . . , N304, respectively. The gate lines G301, G302, . . . , G304 are arranged parallel to each other and extend linearly along the Y-axis direction such that each of the gate lines G301, G302, . . . , G304 passes through the gate areas of the PMOS transistors and the NMOS transistors which correspond to each of the gate lines G301, G302, . . . , G304. Here, the gate lines G301, G203, G201, G107, G105 are connected to dummy gate lines GD2, GD3, GD4, GD5, GD6, respectively, via a connecting line. The other gate lines are provided with a projection. The gate lines G301, G203, G201, G107, G105 may be connected to the dummy gate lines GD2, GD3, GD4, GD5, GD6, respectively, via a metal line.

Figure 15:
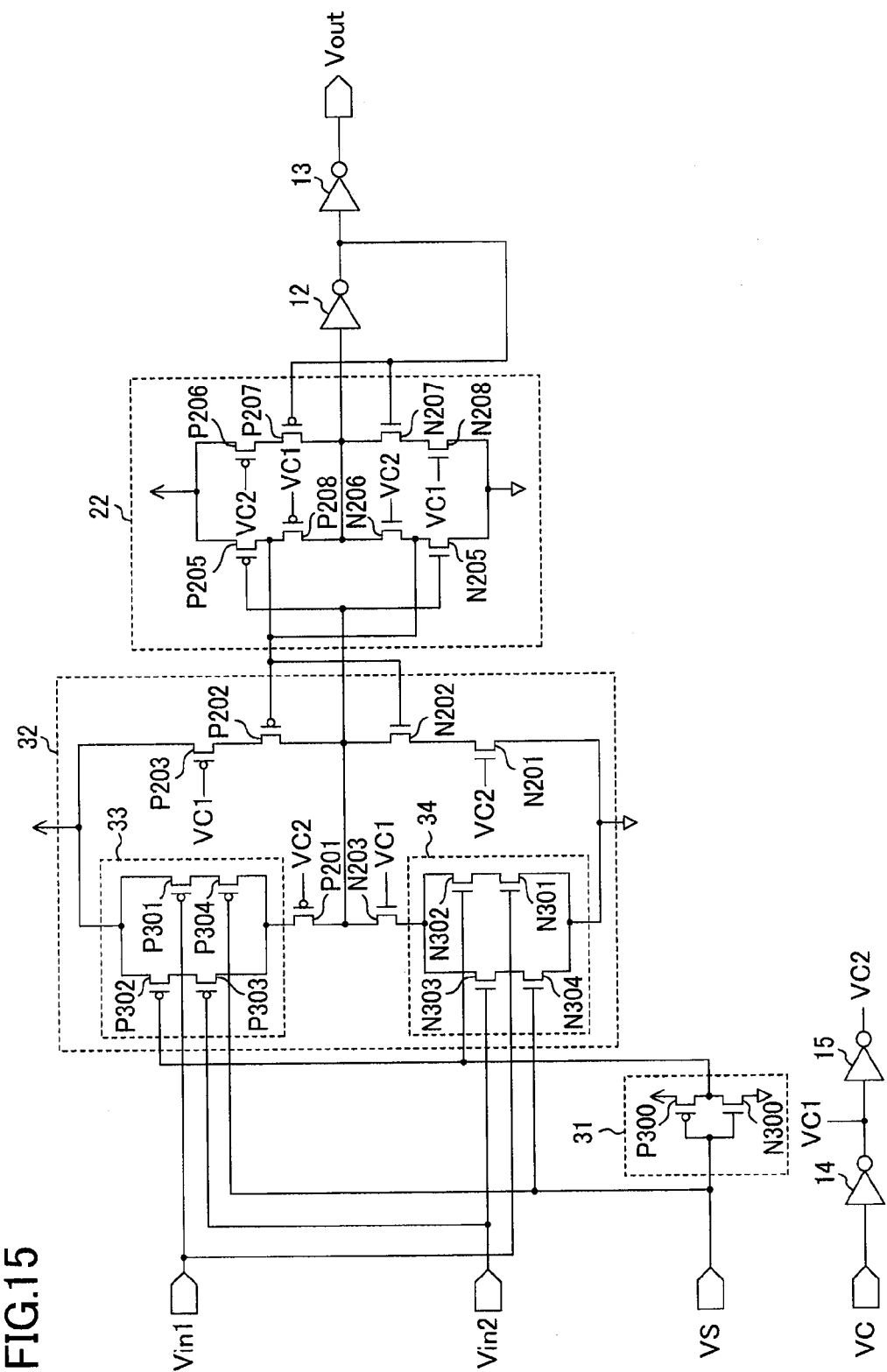
FIG. 15 is a drawing for explaining a circuit configuration of a flip-flop circuit formed in the semiconductor integrated circuit shown in FIG. 13.
Figure 16:
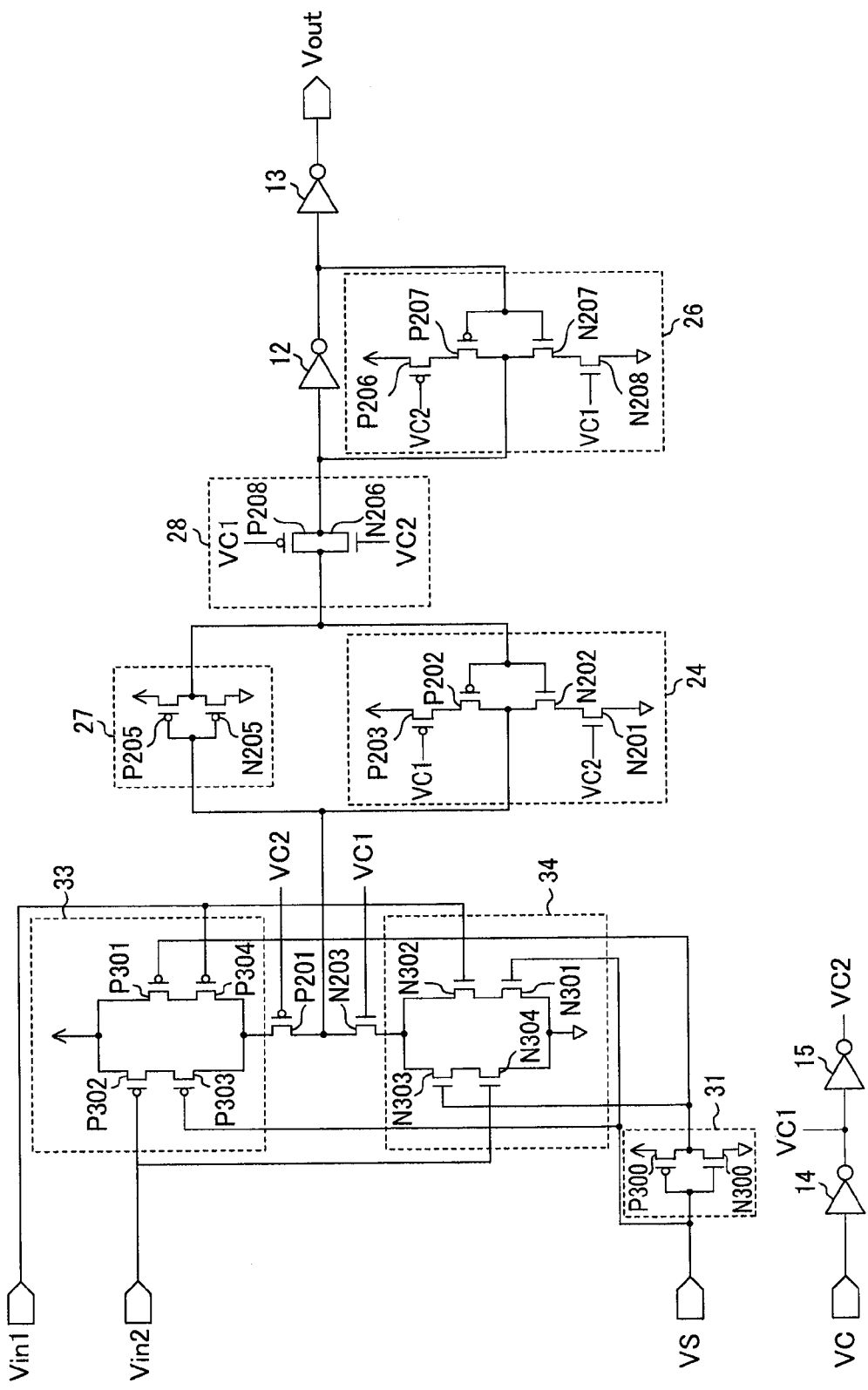
FIG. 16 is a drawing for explaining a circuit configuration of a flip-flop circuit formed in the semiconductor integrated circuit shown in FIG. 13.
Figure 17:
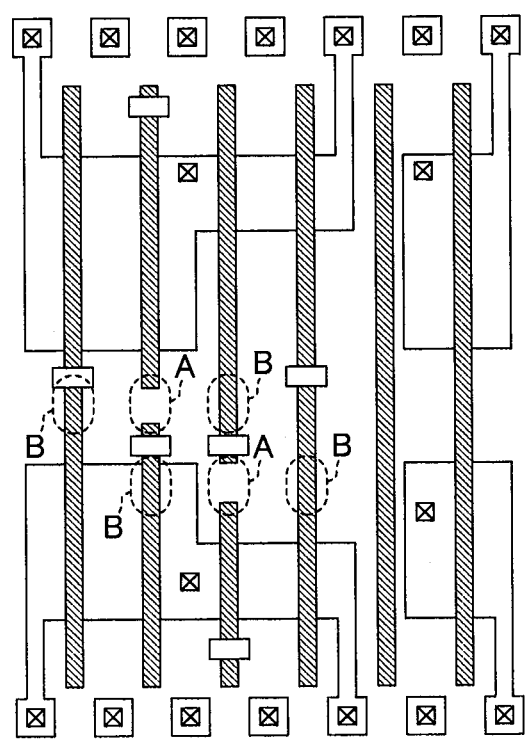
FIG. 17 is a layout of a conventional semiconductor integrated circuit.

The layout shown in FIG. 13 corresponds to the circuit configuration shown in FIG. 15. An inverter 31 includes a PMOS transistor P300 and an NMOS transistor N300. A combinational circuit 32 includes unit circuits 33, 34, the PMOS transistors P201, P202, P203, and the NMOS transistors N201, N202, N203. The unit circuit 33 includes the PMOS transistors P301, P302, . . . , P304. The unit circuit 34 includes the NMOS transistors N301, N302, . . . , N304. The circuit configuration shown in FIG. 15 can be obtained by modifying the circuit configuration shown in FIG. 16. Specifically, the combinational circuit 32 can be implemented by combining the unit circuits 33, 34, the PMOS transistor P201, the NMOS transistor N203, and the tri-state inverter circuit 24, shown in FIG. 16, together. That is, the semiconductor integrated circuit includes, as a standard cell, a flip-flop circuit having the inverter circuits 31, 12, 13, . . . , 15, 27, the unit circuits 33, 34, the PMOS transistor P201, the NMOS transistor N203, the tri-state inverter circuits 24, 26, and the transfer gate 28 (i.e., a flip-flop circuit having an input switching function). In this flip-flop circuit, if the input signal VS is at a high level, the input signal Vin1 is transmitted to the inverter circuit 27, and the input signal Vin2 is cut. If the input signal VS is at a low level, the input signal Vin1 is cut, and the input signal Vin2 is transmitted to the inverter circuit 27. Here, the semiconductor integrated circuit shown in FIG. 13 may include not only the standard cell which functions as a flip-flop circuit, but also other standard cells.

Here, comparison between the combinational circuit 32 in FIG. 15 and the combinational circuit 21 in FIG. 10 shows that the combinational circuit 32 can be configured by replacing the PMOS transistor P204 and the NMOS transistor N204 of the combinational circuit 21 with the unit circuits 33, 34 in FIG. 15. In other words, it is possible to consider that the unit circuits 33, 34 as a self-similar circuit of the combinational circuit 32 are hierarchically included in the combinational circuit 32. Thus, the layout of the semiconductor integrated circuit can be easily designed by designing the unit circuits 33, 34, which are the smallest unit of the combinational circuit 32, and thereafter designing the combinational circuit 32 which includes the unit circuits 33, 34 (i.e., by developing the layout in a hierarchical order) at the time of the layout.

Further, the PMOS transistors P301, P302, . . . , P304 and the NMOS transistors N301, N302, . . . , N304 are arranged such that the PMOS transistor and the NMOS transistor which receive the same signal in the respective gates in the circuit configuration are opposed to each other. Such arrangement allows the linearly extending gate lines G301, G302, . . . , G304 to be laid out. As described, the circuit included in the latch circuit described in the first embodiment is developed as a self-similar circuit in a flip-flop circuit, and thereby, can be applied to a flip-flop circuit having a complex circuit function. Therefore, as in the case of the semiconductor integrated circuit shown in FIG. 8, it is possible to reduce variations in dimensions between transistors, and possible to reduce the size of the semiconductor integrated circuit.

(Other Embodiments)

In the above embodiments, the line paths of the lines (e.g., power supply lines, ground lines, input lines, and output lines) other than the gate lines are not limited to the line paths shown in FIG. 1, FIG. 5, FIG. 8, and FIG. 13. Further, the location of each circuit (e.g., the combinational circuit and the inverter circuit) is not limited to the location shown in FIG. 1, FIG. 5, FIG. 8, and FIG. 13.

<Line Width and Space Between Adjacent Lines>

Further, each of the plurality of gate lines and the plurality of dummy gate lines may have a constant width (a length along the X axis). The space between adjacent gate lines and adjacent dummy gate lines may be constant.

<Gate Width>

Further, each of the plurality of PMOS transistors may have a constant gate width, and each of the plurality of NMOS transistors may have a constant gate width.

As described above, according to the above-mentioned semiconductor integrated circuit, it is possible to reduce variations in dimensions between transistors and reduce the circuit size. Therefore, the above-mentioned semiconductor integrated circuit is useful as a semiconductor integrated circuit in which a standard cell, such as a latch circuit and a flip-flop circuit, is provided.

The foregoing embodiments are merely preferred examples in nature, and are not intended to limit the scope of the present invention, its applications, or use of the invention.

What is claimed is:

1. A semiconductor integrated circuit comprising standard cells, wherein:
    among the standard cells, a latch or a master slave flip-flop includes:
        a plurality of PMOS transistors formed on a substrate along a first direction such that a gate length direction of each of the PMOS transistors is parallel to the first direction;
        a plurality of NMOS transistors which are formed on the substrate along the first direction such that a gate length direction of each of the NMOS transistors is parallel to the first direction, and each of which is opposed to a corresponding one of the plurality of PMOS transistors in a second direction perpendicular to the first direction; and
        a plurality of gate lines which correspond to the plurality of PMOS transistors and the plurality of the NMOS transistors, respectively, and which are arranged parallel to each other and extend linearly along the second direction such that each of the gate lines passes through gate areas of a corresponding one of the PMOS transistors and a corresponding one of the NMOS transistors, and
    the latch or the master slave flip-flop further includes at least one dummy gate line arranged parallel to, and extending linearly along, the second direction together with the plurality of gate lines.

2. The semiconductor integrated circuit of claim 1, wherein at least one pair of a gate line and its adjacent dummy gate line are connected to each other by a connecting line extending from a predetermined location of the gate line to a predetermined location of the dummy gate line.

3. The semiconductor integrated circuit of claim 1, wherein all of the plurality of gate lines have a same width.

4. The semiconductor integrated circuit of claim 1, wherein spaces between adjacent gate lines of the plurality of gate lines have a same width.

5. The semiconductor integrated circuit of claim 1, wherein all of the plurality of PMOS transistors have a same gate width.

6. The semiconductor integrated circuit of claim 1, wherein all of the plurality of NMOS transistors have a same gate width.

7. The semiconductor integrated circuit of claim 1, wherein
    at least one of the plurality of gate lines includes:
        a line main portion which extends linearly along the second direction; and
        a projection which projects out from a predetermined location of the line main portion toward the first direction.

8. The semiconductor integrated circuit of claim 7, wherein
    the projection is connected to an adjacent one of the gate lines.

9. A semiconductor integrated circuit comprising standard cells, wherein:
    among the standard cells, a latch or a master slave flip-flop includes:
        a plurality of PMOS transistors formed on a substrate along a first direction such that a gate length direction of each of the PMOS transistors is parallel to the first direction;
        a plurality of NMOS transistors which are formed on the substrate along the first direction such that a gate length direction of each of the NMOS transistors is parallel to the first direction, and each of which is opposed to a corresponding one of the plurality of PMOS transistors in a second direction perpendicular to the first direction; and
        a plurality of gate lines which correspond to the plurality of PMOS transistors and the plurality of the NMOS transistors, respectively, and which are arranged parallel to each other and extend linearly along the second direction such that each of the gate lines passes through gate areas of a corresponding one of the PMOS transistors and a corresponding one of the NMOS transistors, and
    at least one of the plurality of gate lines includes:
        a line main portion which extends linearly along the second direction; and
        a projection which projects out from a predetermined location of the line main portion toward the first direction.

10. The semiconductor integrated circuit of claim 9, wherein the projection is connected to an adjacent one of the gate lines.

11. The semiconductor integrated circuit of claim 10, wherein
    all of the plurality of gate lines except for the projection have a same width.

12. The semiconductor integrated circuit of claim 10, wherein
    spaces between adjacent gate lines of the plurality of gate lines have a same width.

13. The semiconductor integrated circuit of claim 10, wherein
all of the plurality of PMOS transistors have a same gate width.

14. The semiconductor integrated circuit of claim 10, wherein
all of the plurality of NMOS transistors have a same gate width.

15. The semiconductor integrated circuit of claim 10, wherein:
the latch or the master slave flip-flop further includes at least one dummy gate line arranged parallel to, and extending linearly along, the second direction together with the plurality of gate lines, and
at least one pair of a gate line and its adjacent dummy gate line are connected to each other by a connecting line extending from a predetermined location of the gate line to a predetermined location of the dummy gate line.

16. The semiconductor integrated circuit of claim 9, wherein
all of the plurality of gate lines except for the projection have a same width.

17. The semiconductor integrated circuit of claim 9, wherein
spaces between adjacent gate lines of the plurality of gate lines have a same width.

18. The semiconductor integrated circuit of claim 9, wherein
all of the plurality of PMOS transistors have a same gate width.

19. The semiconductor integrated circuit of claim 9, wherein
all of the plurality of NMOS transistors have a same gate width.

20. The semiconductor integrated circuit of claim 9, wherein:
the latch or the master slave flip-flop further includes at least one dummy gate line arranged parallel to, and extending linearly along, the second direction together with the plurality of gate lines, and
at least one pair of a gate line and its adjacent dummy gate line are connected to each other by a connecting line extending from a predetermined location of the gate line to a predetermined location of the dummy gate line.

* * * * *